United States Patent [19]

Chapman

[11] 4,402,126

[45] Sep. 6, 1983

[54] METHOD FOR FABRICATION OF A NON-VOLATILE JRAM CELL

[75] Inventor: Richard A. Chapman, Dallas, Tex.

[73] Assignee: Texas Instruments Incorporated, Dallas, Tex.

[21] Appl. No.: 264,888

[22] Filed: May 18, 1981

[51] Int. Cl.³ .......................................... H01L 21/265
[52] U.S. Cl. .................................... 29/571; 29/576 B; 29/577 C; 148/187
[58] Field of Search ................. 29/571, 576 B, 577 C; 148/187; 365/178, 182

[56] References Cited

U.S. PATENT DOCUMENTS

| | | | |
|---|---|---|---|
| 4,142,111 | 2/1979 | McElroy | 365/178 |
| 4,151,537 | 4/1979 | Goldman et al. | 365/182 X |
| 4,156,939 | 5/1979 | Takemae et al. | 365/182 |
| 4,201,997 | 5/1980 | Darley et al. | 29/571 X |
| 4,250,206 | 2/1981 | Bate et al. | 148/1.5 X |

*Primary Examiner*—G. Ozaki
*Attorney, Agent, or Firm*—Melvin Sharp; James Comfort; Robert Groover, III

[57] ABSTRACT

A non-volatile memory storage cell utilizing a single vertical junction field-effect transistor is fabricated by a method, which is compatible with the fabrication of MOSFET interface and logic circuits on the same chip. Assembly of a multi-dielectric stack, which contains the non-volatile element, is accomplished late in the process to avoid degradation of the non-volatility characteristics.

11 Claims, 9 Drawing Figures

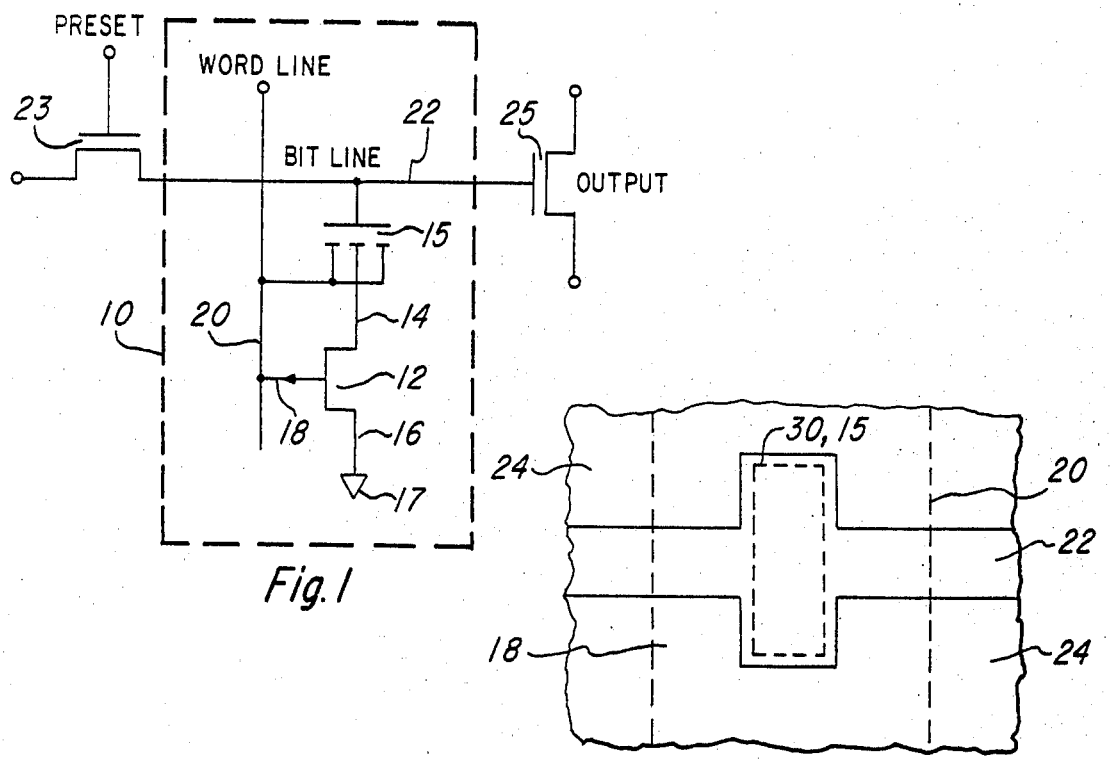
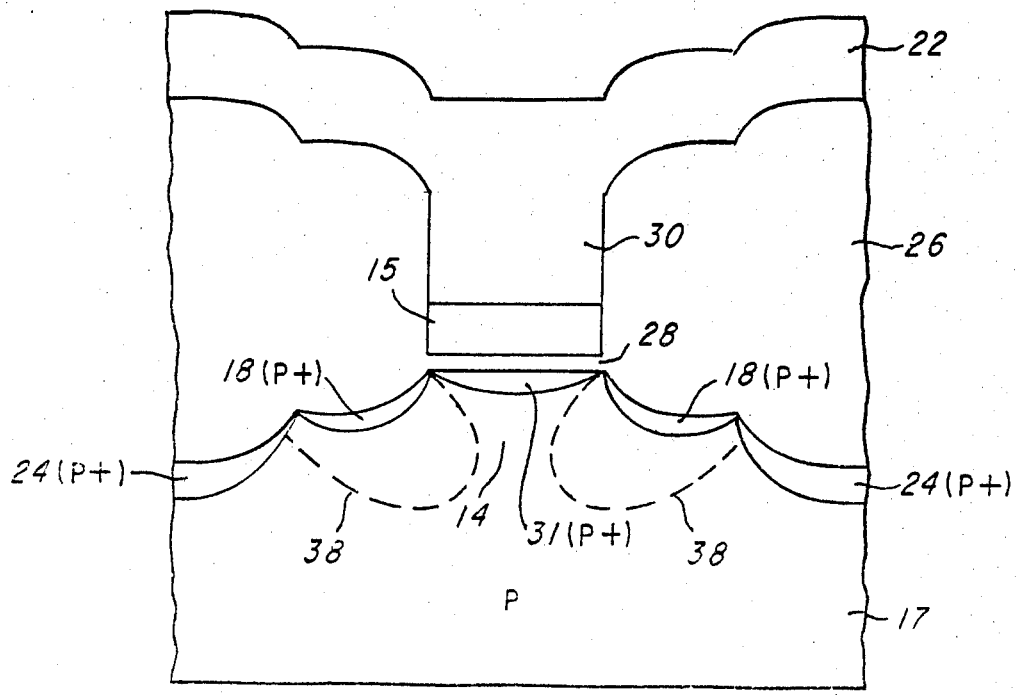

METHOD FOR FABRICATION OF A NON-VOLATILE JRAM CELL

BACKGROUND OF THE INVENTION

This invention releates to fabrication of semiconductor memory devices, and more particularly to the fabrication of non-volatile memory cell using a single J-FET transistor device.

In order to achieve higher packing density in VLSI technology, the number of device structures for a given area must be minimized. In random access memory, another consideration is to have a minimum number of address lines per cell. The goal of one device per cell is obtained by a structure as disclosed in U.S. patent application Ser. No. 219,023 (J. Hynecke, "High Density JFET RAM Cell," filed Dec. 22, 1980). In this dynamic RAM cell, a single vertical J-FET device is the single memory element. In U.S. patent application Ser. No. 228,413 (R. Bates, "non-volatile J-RAM Cell," filed Jan. 26, 1981), a non-volatile gate feature is added to the vertical J-FET cell.

In the fabrication of a cell of this type, several problems are encountered. The first problem is that the non-volatile elements of the cell may suffer degradation of their memory properties. This is due mainly to processes that are performed on the cell to complete it after the non-volatile elements are in place. Another problem is that of process compatibility between the fabrication of the RAM cells and the MOSFET interface and logic circuits which are built on the same chip.

The present invention is directed to a method of fabrication of a non-volatile (NVJRAM) cell which would have the non-volatile element placed in the device late in the process to avoid deleterious effects due to temperature cycles. Also, the method would accommodate the fabrication of logic circuits on the periphery of a chip to interface the RAM with other elements. The present invention, therefore, has an object of providing a method for fabrication of a non-volatile RAM cell without damage to the memory element. Another object is to provide a method for fabrication of the non-volatile RAM array that will allow interface logic circuits to be constructed on the same chip at the same time.

SUMMARY OF THE INVENTION

In one aspect of the invention, standard semiconductor fabrication process steps, well known in the art, are employed in a novel sequence to avoid damage or degradation of characteristics on any part of a finished non-volatile JRAM array. Another aspect of the invention is the concurrent fabrication of the interface and logic circuits in MOSFET technology on the chip.

A semiconductor substrate is patterned to form channels of one conductivity type, separated by channel "stops," or areas of the opposite conductivity type. Vertical JFET's are constructed on the channels, or word lines, and a layer of insulating material placed over the devices. A multi-dielectric stack having non-volatile characteristics is formed directly over the source of the JFET in each cell, and a metal interconnection is made to the stack to serve as a bit line. A metal connection is also made to the channels in the substrate as a word addressing means. MOSFET devices are constructed on the same chip at the same time, by appropriate masking at each process step, thereby allowing only the necessary processes to affect that area of the chip on which the MOSFET devices are located.

BRIEF DESCRIPTION OF THE DRAWINGS

FIG. 1 is a schematic CIRCUIT diagram of one cell of the product of the present invention.

FIG. 2 is a cross-sectional view of the completed cell structure of the invention.

FIG. 3 is a top view of a cell completed by the present invention.

DETAILED DESCRIPTION OF THE DRAWINGS

Figure 4:
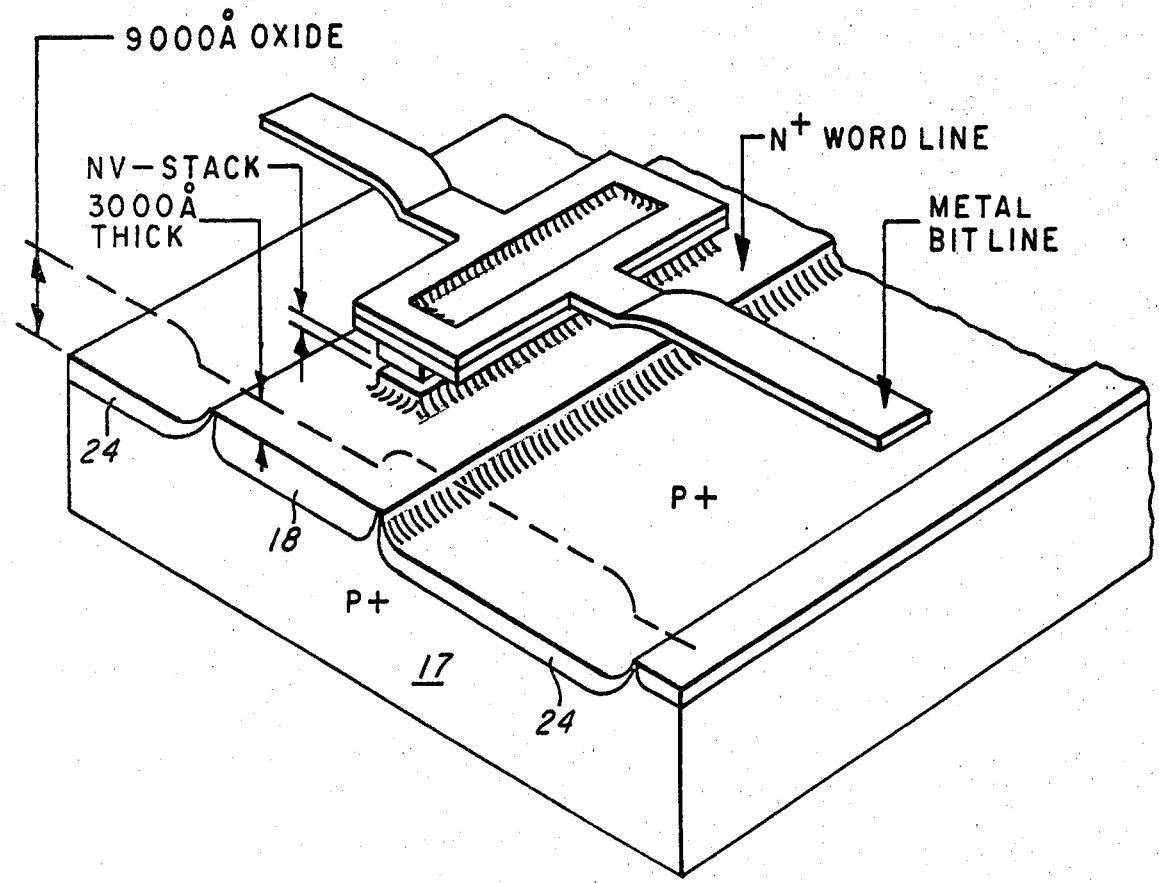
FIG. 4 is a perspective view, partially cut array, showing the geometry of a cell done by the present invention.

Referring now to the drawings, there is shown in FIG. 1 a schematic circuit diagram of a single, nonvolatile, junction field-effect transistor random access memory (JRAM) cell 10 according to the present invention. Memory cell 10 is formed of a vertical JFET 12 having a source 14 capacitively coupled to a multi-dielectric storage element 15, a drain 16 directly connected to the substrate 17, and a gate 18 which is part of a word line 20. Storage element 15 is also coupled to a bit sense line 22. A typical RAM is formed of a matrix of cells 10 coupled to a plurality of rows of sense lines 22 and columns of word lines 20. A specific cell is addressed by simultaneous impulses on the corresponding bit sense and word lines. A preset transistor 23 and an output transistor 25 are provided for applying write and erase potentials to bit sense line 22 and for sensing the output of storage element 15 during the read operation. The output transistor may be replaced by the type of sense/latch circuit common to dynamic RAM devices currently known in the art.

Referring to FIGS. 2 and 3, the structure of cell 10 may be better understood. A portion of a semiconductor substrate, e.g., silicon, is shown generally at 17. The substrate may be either N-type or P-type depending upon design considerations. For purposes of illustration, it will be assumed that a P-type substrate is utilized.

Word line 20 is an elongated N+ region which also forms the gates 18 for all of the JFETs in a column. A P+ region on either side of the gate region 18 forms a channel stop 24 to isolate the cell 10. A relatively thick insulating layer 26 of, for example, silicon dioxide overlying the gate 18 and channel stop 24 regions has thin gate oxide region 28 overlying the source 14 of JFET 12. Storage element 15 is formed of a multi-dielectric structure overlying gate oxide 28 and surrounded by oxide layer 26. Overlying the storage element 15 is a region 30 that forms a contact electrode that is part of a conductive strip of, for example, aluminum which forms bit sense line 22.

In a preferred embodiment of the present invention, semiconductor substrate 17 is, for example, p-type silicon having a low resistivity, such as 0.2 Ω/cm, and a covering of epitaxial silicon approximately 0.4 to 0.5 mil deep having a sheet resistance of from 20–30 Ω/cm when the memory element electrode 30 has a minimum width of 0.2–0.25 mils. Smaller minimum widths require epitaxial resistivities less than 20–30 Ω/cm. On this surface is grown a layer of silicon oxide 52 about 1000 Å deep, using a standard thermal oxidation furnace.

Figure 5A:
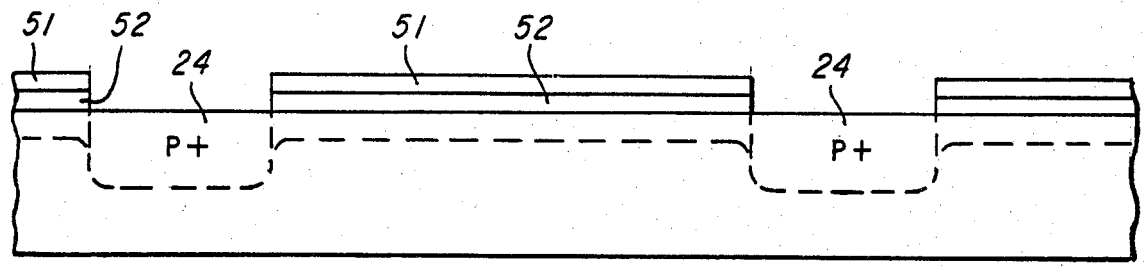
FIGS. 5a–5e are cross-sectional drawings of the structure at various stages of completion of the disclosed method of fabrication.

Next, a layer of approximately 1400 A of silicon nitride 51 is deposited over the SiO$_2$. The device is then coated with photo resist, and areas to be etched are masked, then the slice exposed. The mask is removed, then the photoresist developed, and the non-exposed photoresist stripped away. Next, a plasma etch removes the areas of exposed nitride. Then, a Bell-2 etch removes the exposed oxide. After a rinse to remove the photo resist, boron is implanted in the exposed substrate areas in a dosage of $4 \times 10^{13}$/cm$^2$ at 40 KeV to form P+ channel stops 24. At this point, a cross section of the device is as shown in FIG. 5a.

Figure 5B:
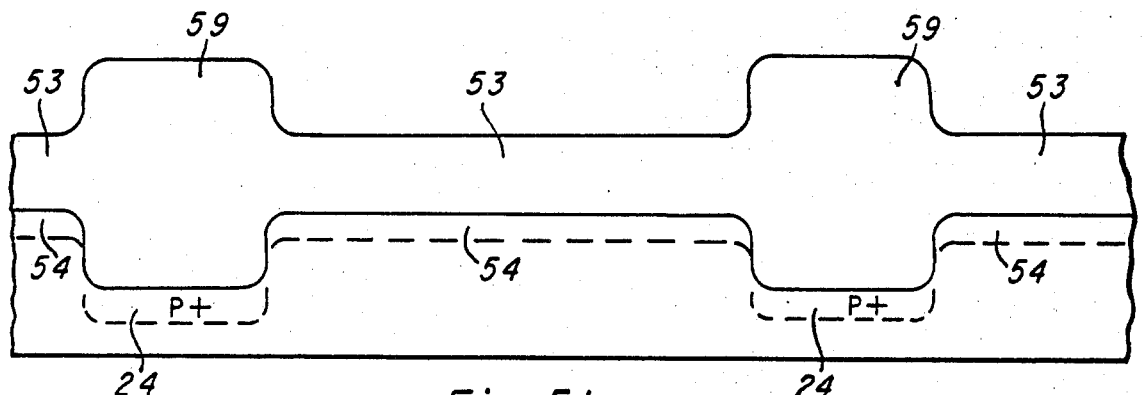

Next, the slice is placed in a thermal oxidation furance at 1000° C. to grow an oxide layer 59 over the exposed substrate to a thickness of 9000–10,000 A. Now, etch away the Si$_3$N$_4$ and SiO$_2$. A layer of SiO$_2$ 53 is grown on the exposed substrate to a depth of 800 A, and a mask step covers the thick oxide area. The substrate covered only by the 800 A SiO$_2$ is now subjected to an ion implantation step which implants boron into the substrate at a dosage of 2 to $5 \times 10^{12}$/cm$^2$ at 40 KeV to form a thin p+ region 54. After the masking is removed, the structure is as shown in FIG. 5b.

Figure 5C:
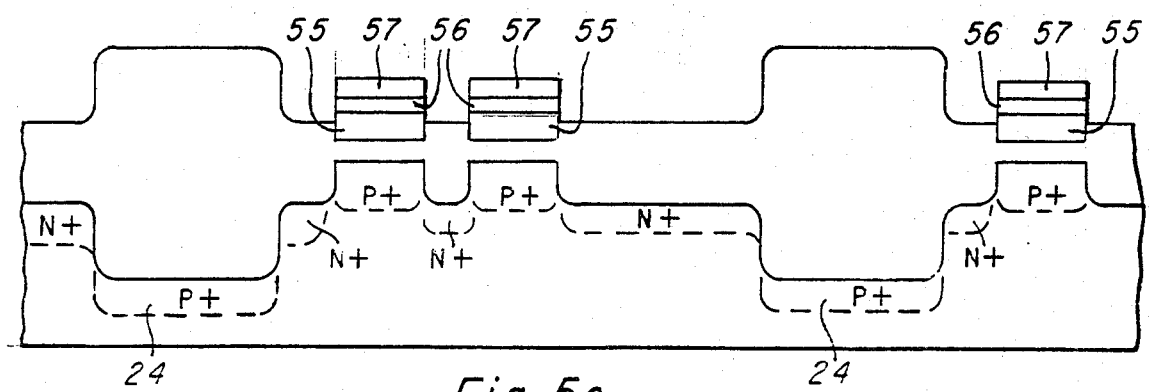

Now, 5000 A of polysilicon 55 is deposited on the thin oxide layer area using a hot-wall reactor at 620° C. Then, phosphorus is deposited and diffused at a dosage of to create N-type conductivity in the polysilicon. Next, a layer of SiO$_2$ approximately 200 A thick 56, and a layer of insulator such as silicon nitride approximately 1400 A thick 57, respectively, are grown over the polysilicon. The silicon nitride, or other insulator, must not be easily oxidized, but must be etched away later with an etchant that does not etch SiO$_2$ rapidly. The remainder of this description will assume a silicon nitride insulator. A masking operation is performed, and the undesired areas of silicon nitride and polysilicon are etched away. With the photoresist still in place, phosphorus is ion-implanted in the exposed areas in dosage sufficient to overcome the thin P+ doping previously accomplished and cause the area to become N+ type. The photoresist is now removed, and a layer of SiO$_2$ 60 is grown over the N+ areas to a depth of about 3000 A. The device is then as shown in FIG. 5c.

Figure 5D:
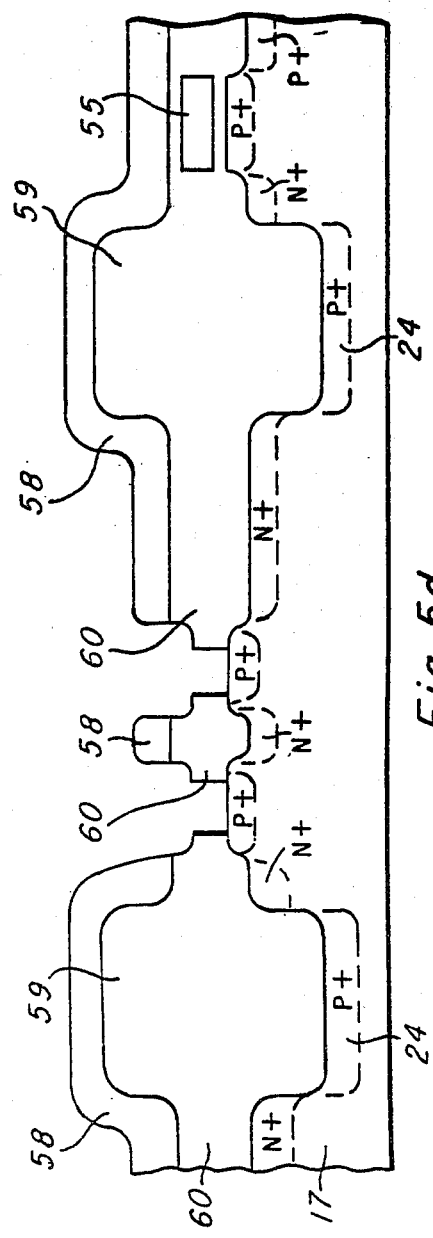

The next step is to coat the device with photoresist 58 mask to the appropriate areas, then develop the photoresist and strip away those areas not developed. An alternative step at this point is to etch away the silicon nitride layer over SiO$_2$ and polysilicon, then proceed with the photoresist. In either case, the nitride, oxide, and polysilicon areas are etched away, as well as the gate oxide on the surface of the substrate. Note that, as shown in FIG. 5d, the nitride, oxide and polysilicon areas on the right side of the drawing are shown under photoresist. This is to illustrate the order of events for the MOSFET devices which are to be built as interface logic for the RAM cells. The structure is now as shown in FIG. 5d.

The last series of steps puts in place the non-volatile multi-dielectric stack. The placement of these steps at the end of the fabrication process avoids having the multi-dielectric stack subjected to temperature cycling, which would have an adverse affect on the non-volatile characteristics of the cell.

Figure 5E:
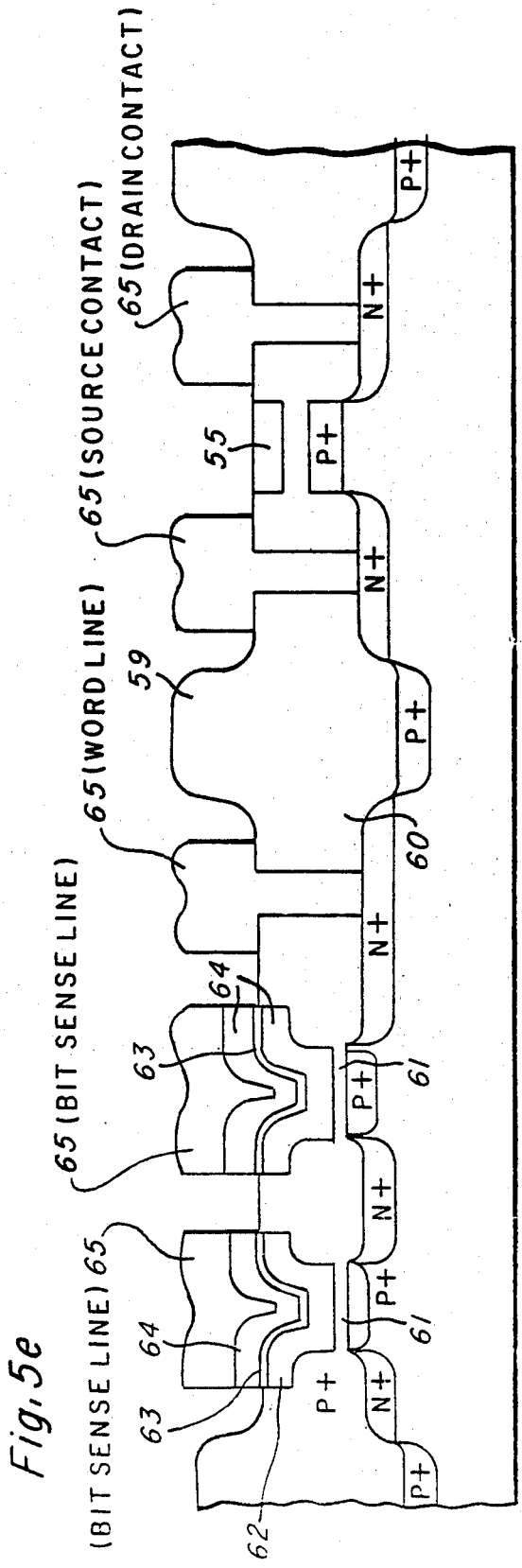

The photoresist 58 is stripped away, and then a thin layer of SiO$_2$ 61 approximately 20–40 A thick is grown on the exposed substrate. A layer of silicon nitride 62 is now deposited over the SiO$_2$ to a thickness of 75–500 A. In an alternative step, if the subsequent optional step of depositing titanium oxide (TiO$_2$) on the stack is not used, the thickness of the silicon nitride should be at least 150 A, up to 500 A. After the silicon nitride is deposited, the top 50 A is thermally oxidized to convert it to SiO$_2$ 63. Now that titanium is deposited. Then photoresist is applied and patterned so that non-volatile areas will be covered after exposure and development, and stripping of excess photoresist. The undesired titanium is etched away, and the photoresist is removed from the non-volatile areas. The titanium is oxidized to convert it to TiO$_2$ 64. Now the oxide is etched off to expose the polysilicon in the MOSFET area. Photoresist is applied, and patterned to remove excess photoresist, then oxide is patterned in selected areas to form vias to the substrate. Photoresist is then removed, and a short clean-up etch is done to insure no oxide remains on the polysilicon or in the vias. Then aluminum or other metal 65 is deposited for interconnection. Photoresist is applied and patterned, followed by and the etching away of undesired metal. The structure is now completed except for connections to the chip header, and is as shown in FIG. 5e.

What is claimed is:

1. A method for fabrication of a non-volatile, random-access data storage cell, comprising the steps of:
   (a) forming channels of one conductivity type separated by areas of the opposite conductivity type on a semiconductor substrate;
   (b) constructing vertical JFET devices having source regions of said one conductivity type at spaced intervals along said channels;
   (c) forming multi-dielectric stacks in such a proximity to the source region of each said JFET device so as to capacitively couple said multi-dielectric stacks to said source regions; and
   (d) forming metal lines for interconnection of said cells and peripheral devices contained on said substrate.

2. A method as in claim 1, wherein said semiconductor substrate is of P-type conductivity.

3. A method as in claim 2, wherein said first dopant material is boron.

4. A method as in claim 3, wherein said second dopant material is phosphorus.

5. A method as in claim 4, wherein said multi-dielectric stack comprises:
   a first thin layer of silicon oxide;
   a second thin layer of silicon nitride;
   a third thin layer of silicon oxide having a thickness greater than said first thin layer and less than said second thin layer; and
   a fourth layer of titanium oxide.

6. A method as in claim 5, wherein said fourth layer of titanium oxide is optional.

7. A method for fabrication of a non-volatile data storage cell comprising the steps of:
   (a) patterning a semiconductor substrate by masking and insulating, and subsequently ion-implanting a first dopant material in exposed areas of said substrate to form channel stops;
   (b) preparing said patterned substrate for further ion-implant by further masking and insulating, and ion-implanting of exposed areas with said first dopant to form sources;
   (c) forming an insulating layer in desired areas, and subsequently ion-implanting the exposed areas with a second dopant to form word line areas of conductivity opposite that of said substrate;

(d) removing selected insulating materials;
(e) forming a multi-dielectric stack directly upon selected exposed areas of substrate;
(f) removing insulating layer in selected areas to expose substrate; and
(g) forming patterns of conductive material for interconnection of said substrate and other elements of cell and other devices on said substrate.

8. A method for fabricating a non-volatile data storage cell, comprising the steps of:
 (a) forming first and second insulating layers on a semiconductor substrate;
 (b) masking and etching said first and second insulating layers to expose said semiconductor substrate in desired areas;
 (c) ion-implanting a first dopant material in said exposed areas of semiconductor substrate in a heavy concentration;
 (d) forming a first thick insulating layer over said ion-implanted areas of semiconductor surface;
 (e) removing the remainder of said first and second insulating layers and forming in their place a third thin insulating layer;
 (f) masking said areas covered by a thick insulating layer, and ion-implanting said areas covered by thin insulating layer with said first dopant material in a light concentration;
 (g) forming a plurality of multi-layer areas, each said area consisting of:
  (1) a thick layer of semiconductor material, deposited on said semiconductor substrate and having a second dopant material therein to cause it to be of high conductivity for the purpose of providing a gate region for MOSFET devices constructed on the periphery of said semiconductor substrate;
  (2) a thin insulating layer overlying said thick layer of semiconductor material.
  (3) a thick insulating layer, overlying said thin insulating layer;
 (h) doping areas not covered by said multi-layer areas with a second dopant material in a dosage amount sufficient to create areas of conductivity opposite that of said semiconductor substrate;
 (i) forming a second thick insulator layer over the device except for said multi-layer areas, and areas covered by said first thick insulator layer;
 (j) masking device areas except for selected said multi-layer areas, removing selected said multi-layer areas to expose said semiconductor substrate; and
 (k) forming a multi-dielectric stack comprising:
  (1) a first thin insulating layer overlying said semiconductor substrate;
  (2) a second thin insulating layer directly upon said first insulating layer;
  (3) a third insulating layer directly over said second insulating layer;
  (4) a fourth insulating layer directly over said third insulating layer;
 (l) etching vias in thick oxide to expose selected substrate locations; and
 (m) making and forming a layer of conductive material for interconnections.

9. A method as in claim 8, wherein said semiconductor substrate is of N-type conductivity.

10. A method as in claim 9, wherein said first dopant is phosphorus.

11. A method as in claim 10, wherein said second dopant is boron.

* * * * *